United States Patent [19]

Diepers et al.

[11] 3,985,281

[45] Oct. 12, 1976

[54] METHOD OF PRODUCING AN ELECTRICAL CONDUCTOR

[75] Inventors: Heinrich Diepers, Erlangen-Bruck; Hans Pfister, Erlangen; Karl-Heinz Jablonski, Ebermannstadt, all of Germany

[73] Assignee: Siemens Aktiengesellschaft, Munich, Germany

[22] Filed: June 9, 1972

[21] Appl. No.: 261,246

[30] Foreign Application Priority Data

June 15, 1971 Germany............................ 2129624

[52] U.S. Cl................................ 228/148; 228/238; 228/263; 29/599; 427/62; 427/120; 427/124; 427/250
[51] Int. Cl.²...................... B05D 5/12; C23C 11/00
[58] Field of Search .......... 117/227, 230, 231, 107; 29/599; 427/62, 63, 250, 120, 124; 228/263, 126, 148, 238

[56] References Cited
UNITED STATES PATENTS

| | | |
|---|---|---|
| 3,409,469 | 11/1968 | Kuntz.................................. 117/231 |
| 3,449,092 | 10/1969 | Hammond....................... 117/107 R |
| 3,465,429 | 9/1969 | Barber................................... 29/599 |
| 3,465,430 | 9/1969 | Barber................................... 29/599 |
| 3,556,837 | 1/1971 | Hammond....................... 117/107 R |
| 3,576,670 | 4/1971 | Hammond....................... 117/107 R |
| 3,595,693 | 7/1971 | Cecil..................................... 117/227 |
| 3,616,530 | 11/1971 | Chester................................. 29/599 |
| 3,710,000 | 1/1973 | Shatter................................. 29/599 |

*Primary Examiner*—Michael F. Esposito
*Attorney, Agent, or Firm*—Kenyon & Kenyon Reilly Carr & Chapin

[57] ABSTRACT

A method of producing a conductor for a superconducting cable or the like is disclosed. The conductor is made up of at least niobium and copper of which the copper is an electrically normal-conducting metal. The method includes heating a niobium carrier to a temperature between 150° and 800°C in a vacuum having a residual gas pressure of at most 10⁻⁴Torr, and evaporating copper unto the niobium carrier to form a tightly adhering copper layer thereon. If required, the conductor can be produced to include other electrically normal-conducting metals.

10 Claims, 7 Drawing Figures

METHOD OF PRODUCING AN ELECTRICAL CONDUCTOR

BACKGROUND OF THE INVENTION

The invention relates to a method of producing a conductor composed of niobium and copper and, if required, other electrically normal-conducting metals. The method is especially applicable for producing conductors for superconducting cables.

In the manufacture of various superconducting components, such as superconducting cables for the transmission of large amounts of electric energy, particularly for single-phase and three-phase alternating current, or band-shaped alternating current superconductors, it is often desirable to bond a superconductive layer of niobium to a metal which has a good thermal conductivity and which has good normal-conducting characteristics at the low temperature required for maintaining the superconductivity of the niobium. Niobium is a particularly well suited superconductor for single-phase and three-phase cables because it has a very high, below critical magnetic field $H_{cl}$ of about 120,000 A/m. Thus it appears advantageous for superconducting single-phase or three-phase cables to arrange, for example, copper or aluminum tubes coaxially with respect to each other, the tubes being provided on the outside or inside with a layer of niobium. Preferably, the niobium layer is on the outside of the inner tube and on the inside of the outer tube. By making the inner tube the outgoing conductor and the outer tube as the return conductor, the electric and magnetic fields occur only in the space between the niobium layers, and the tubes of electrically normal-conducting metal remain free of fields, so that no eddy current losses can occur therein.

The normal-conducting metal serves here particularly to electrically stabilize the superconducting niobium by taking over at least partially the currents flowing in the superconducting niobium if the niobium passes from the superconducting to the electrically normal-conducting state, for example, as can happen in the event of an overload. The normal-conducting metal also diverts the heat loss generated in the niobium in such instances or by alternating-current losses in the niobium to an adjoining cooling medium which is preferably liquid helium. For this purpose, the closest possible electrically and thermally good conducting contact between the niobium and the electrically normal-conducting metal is required.

A close, highly adhesive bond of niobium with highly conductive metals such as copper, however, presents considerable difficulties and cannot be achieved, for example, by simply soldering copper to niobium or by electrolytic deposition of copper on niobium. The known method of coating copper with niobium by electrolytic deposition of the niobium in a melt on a copper carrier are not applicable in cases where a prefabricated niobium part, for example, a niobium foil, is to be connected with the normal-conducting metal such as copper. This is often desirable for manufacturing reasons, for example, if a prefabricated niobium foil is to be used as the superconductor, and is necessary particularly if the niobium is to be subjected to pretreatments for reducing the alternating current losses, for example, annealing for several hours at temperatures of 2000°C or more in an ultra-high vacuum. Because of the low melting temperature of copper, such an annealing treatment of a niobium layer already deposited on a copper carrier is not possible, because already at temperatures near the melting point of the copper, deformations of the copper carrier occur due to creep processes and are intolerable for later applications. In such a case, the niobium must therefore be first annealed alone and can be bonded to the copper only after the annealing. Also in other cases it may be necessary for manufacturing reasons to prefabricate the niobium parts, and to only then bond these parts to copper.

In the U.S. patent application Ser. No. 23,359, filed on Mar. 27, 1970, now U.S. Pat. No. 3,703,447, it is suggested that for coating niobium with copper, the metallically clean niobium surface to be coated be brought into contact with copper which is metallically clean at least on the surface and to then bond the copper to the niobium by subsequently heating the niobium to a temperature of between 800° and 2500°C in a vacuum with a residual gas pressure of at most $10^{-6}$ Torr.

Although this method yields an intimate bond between niobium and copper, it is expensive because of the high temperatures involved. At these high temperatures there furthermore exists the danger that the niobium can absorb such residual gases as oxygen and hydrogen even in a high vacuum because of its high reactivity with respect to these gases. Since, especially in the case of alternating current superconductors, the current is transported only in a thin surface layer, such gas reactions are undesirable because of an increase in the alternating current losses associated therewith.

SUMMARY OF THE INVENTION

It is an object of the invention to provide a method of producing a conductor composed of at least niobium and copper for superconducting cables and the like. Subsidiary to this object, it is an object of the invention to provide such a method which, if required, can include a step for providing the conductor with an additional electrically normal conducting metal.

It is another object to provide a method of producing the conductor composed of at least niobium and copper which overcomes the disadvantages discussed above in connection with prior art methods and which is simpler to perform.

According to a feature of the invention, a niobium carrier is heated in a vacuum with a residual gas pressure of at most $10^{-4}$ Torr to a temperature of between 150° and 800°C. A tightly adhering copper layer is provided on the carrier by evaporating copper in the vacuum.

The relatively low temperatures used in performing the method notwithstanding, a particularly intimate diffusion bond between the niobium and the vapor-deposited copper is obtained. With respect to achieving a good diffusion bond on the one hand, and avoiding gas absorption by the niobium on the other hand, it is particularly advantageous to heat the niobium carrier to a temperature between about 200° and 600°C.

A feature of the invention that is especially advantageous because of its simplicity provides that the copper is vapor-deposited on the hot niobium carrier. A diffusion bond between the niobium and the copper is then already brought about during the vapor-deposition. By heating of the niobium carrier, possibly troublesome adsorption layers are furthermore removed, such as, for example, water and residues of organic solvents which were used for cleaning the niobium carrier. Generally, commercially available niobium sheet and foil can be used.

Another feature of the invention for producing a tightly adhering copper layer on the niobium carrier provides that the niobium carrier is first heated in a vacuum and is then allowed to cool. Thereafter, the copper is vapor-deposited onto the cooled down niobium carrier and then, the niobium carrier is again heated with the copper vapor-deposited thereon.

Because the depth of penetration of the current is superconducting niobium is only very small below the lower critical magnetic field $H_{c1}$ and because only a very thin niobium layer is therefore utilized for the conducting current, it is advantageous particularly for producing a conductor for an alternating current cable, to use as the niobium carrier a thin foil which preferably may be a few $\mu$m to about 0.5 mm thick. Such a foil can advantageously be vapor-deposited with a 1 to 5 $\mu$m thick copper layer. The niobium carrier is preferably foil-shaped and can have the form of a ribbon and can be vapor-deposited with copper on one side. However, the niobium carrier can also be made in the form of a tube and be vapor-deposited on its outside.

Especially in the case of conductors for superconducting cables, the thin vapor-deposited layer will as a rule not be sufficient for the electrical stabilization of the niobium, nor for the mechanical support of the preferably thin niobium layer under the operational requirements of a cable. Adequate electrical stabilization and mechanical support can be achieved, according to further feature of the invention; this feature includes bonding the niobium carrier with the aid of the copper layer to an additional electrically normal-conducting metal.

Especially for producing a tubular conductor, one or several ribbon-shaped niobium carriers can be bonded to a tube consisting of electrically normal-conducting metal by means of the copper layer on the niobium carrier. The copper layer can advantageously be soldered here with the electrically normal-conducting metal or be alloyed with it. There is further the possibility to reinforce the copper layer through electrolytic deposition of additional electrically normal-conducting metal. As the additional electrically normal-conducting metal, particularly copper can be used. The niobium foils can also be applied by means of the vapor-deposited copper layers to metals other than copper; these metals being solderable to or alloyable with copper as, for example, aluminum, nickel, copper-nickel and copper-nickel-beryllium alloys.

Because of the feature of the vapor-deposited copper layer a thin niobium foil can be joined to an additional electrically normal-conducting material so as to provide a good electrical and thermal connection. For this reason it is especially well suited to the manufacture of a conductor for superconductive cables composed of niobium and copper and, if required, other electrically normal-conducting metals.

Although the invention is illustrated and described herein as a method of producing an electrical conductor, it is nevertheless not intended to be limited to the details shown, since various modifications may be made therein within the scope and the range of the claims. The invention, however, together with additional objects and advantages will be best understood from the following description and in connection with the accompanying drawings.

DESCRIPTION OF THE PREFERRED EMBODIMENTS

Figure 1:
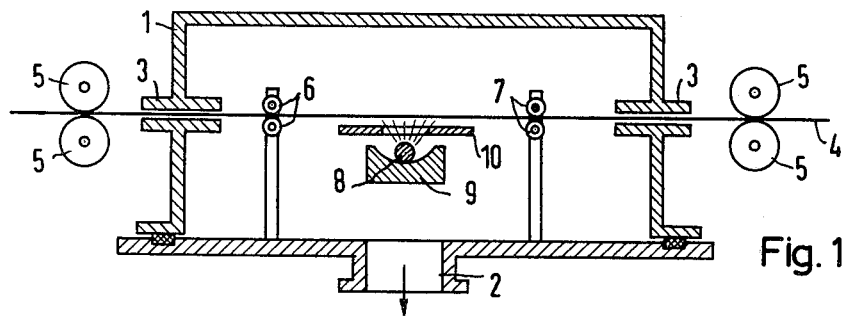
FIG. 1 is a schematic diagram, partially in section, showing an apparatus for performing the method of the invention.

The apparatus shown in FIG. 1 is used for making vapor-depositions on a hot niobium carrier. It consists essentially of a housing 1, which can be evacuated through a vacuum connection 2. Vacuum-tight feed-throughs 3 are provided in the walls of the housing 1 through which the niobium carrier 4 can be introduced and withdrawn again. For moving the niobium carrier, motor-driven transport rollers 5 are provided and inside the housing 1, the niobium carrier is led through respective pairs of contact rollers 6 and 7. The contact rollers 6 and 7 are connected with a current source not shown and function to heat the niobium carrier 4 by means of the direct passage of current. The copper 8 to be evaporated is disposed in a tungsten boat 9 and is heated approximately to its melting temperature. A diaphram 10 is located between the evaporation source and the niobium carrier 4 receiving the vapor deposition.

Figure 2:
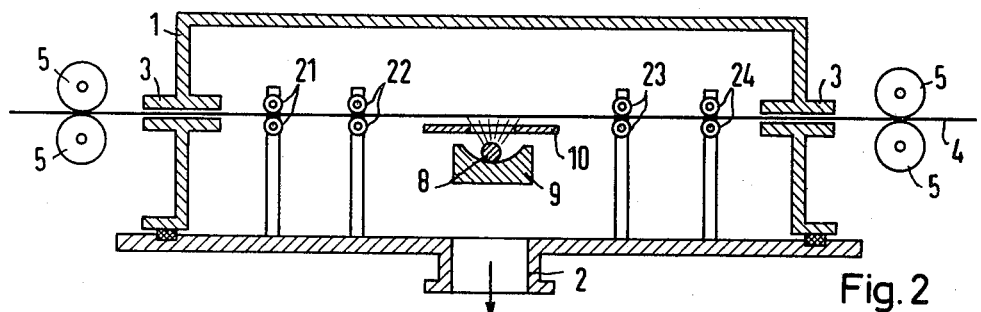
FIG. 2 shows a modified apparatus somewhat similar to the apparatus shown in FIG. 1 wherein a niobium carrier can be heated and cooled prior to receiving a vapor-deposition of copper according to another embodiment of the method invention.

The apparatus shown in FIG. 2 is used to vapor deposit onto a niobium carrier that is first heated, and then subjected to vapor deposition in a cooled-down condition and is subsequently heated once again. This apparatus is distinguished from the apparatus of FIG. 1 essentially only by the feature that, in lieu of the contact roller sets 6 and 7 which include the evaporation source 8 between them, pairs of contact roller sets (21, 22), (23, 24) are arranged in front of and behind the evaporation source respectively. These pairs of contact roller sets respectively heat the niobium carrier 4 by means of the through passage of current prior to and after evaporation. All other parts of the apparatus according to FIG. 2 are labelled with the same reference numerals used for corresponding parts of the apparatus of FIG. 1.

EXAMPLE 1

By means of the apparatus shown in FIG. 1, a niobium strip about 50 mm wide and 0.1 mm thick is vapor-deposited with copper. The strip is heated by passing current directly therethrough to about 250°C. The distance between the niobium ribbon 4 and the vapor source 8 is about 120 mm and the aperture in the diaphram 10 is about 50 mm × 150 mm. With the strip moving at a velocity of about 75 mm/min and an evaporation rate of 5000 A of copper per minute, a strongly adhering 1 $\mu$m thick copper layer is deposited on the niobium ribbon 4. During the evaporation, the apparatus is evacuated to about $10^{-5}$ Torr. The running time of the heated niobium band up to the time that copper appears, or more specifically up to the start of the evaporation, is about 2 minutes. The duration of the preheating period is, however, not particularly critical. During the evaporation, the vapor-deposited niobium ribbon usually heats up somewhat.

Correspondingly good results are obtained with evaporation from niobium ribbons when the ribbons are heated by passing current therethrough to temperatures between 150° and 800° C, in particular about 200° to 600°C, immediately prior to and during evaporation. At higher temperatures, a re-evaporation of the copper occurs. By changing the velocity of the ribbon and/or the evaporation rate, or the opening of the diaphram, thicker copper layers with thicknesses of up to 5 $\mu$m can also be vapor-deposited on the niobium foils in a simple manner.

In lieu of the heated tungsten boat 9, an electron beam evaporator, for example, can also be provided as the vapor source for the copper.

EXAMPLE 2

By means of the apparatus shown in FIG. 2, a niobium ribbon which is also about 50 mm wide and about 0.1 mm thick can be provided on one side with a copper layer approximately 3 $\mu$m thick. Prior to the actual evaporation, the niobium ribbon was preheated between the pair of contact roller sets 21 and 22 for about 2 minutes to approximately 300°C. After being allowed to cool down, the niobium carrier is vapor-deposited with copper and after the evaporation, the copper coated carrier is heated between the pair of contact roller sets 23 and 24 for about 2 minutes to a temperature of about 200° to 300°C. The preheating serves to clean the niobium surface onto which the copper is to be vapor-deposited, and the subsequent heating forms a diffusion bond between the niobium and the copper.

Figure 3:
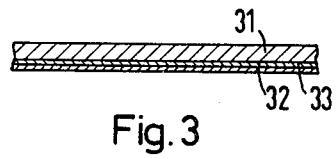
FIG. 3 illustrates a ribbon-shaped niobium foil provided with a copper layer according to the method of the invention.

A ribbon-shaped niobium foil provided with a copper layer according to one of the examples 1 or 2 is schematically shown in FIG. 3. The vapor-deposited copper layer 32 is located on the bottom side of the niobium foil 31 and is intimately bonded to the niobium foil by a diffusion zone 33.

Such niobium foils with vapor-deposited copper can advantageously be applied to the outside or the inside of a copper tube in the manufacture of a superconducting cable, whereby, for example, the copper layer vapor-deposited onto the niobium foil is soldered to the copper tube, which may, for example, have a wall thickness of about 1 millimeter. The niobium foil can be placed around the tube, or a plurality of niobium foils in strip form can be applied to the tube lengthwise. This is particularly of advantage if, instead of cylindrical tubes, tubes with a more complex geometry, such as corrugated tubes, are to be coated with niobium foil.

Figure 4:
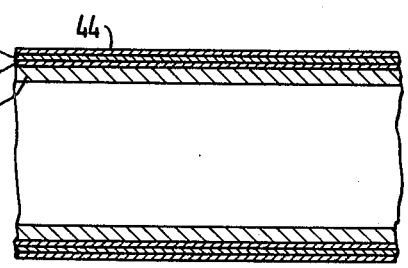
FIG. 4 is an elevation view, in section, of a copper tube to which is joined copper coated niobium foil according to another embodiment of the method invention.

FIG. 4 shows a schematic longitudinal cross-section of a copper tube 41 for a superconducting cable. To the outside of the cable, a niobium foil 44 is applied. The foil 44 is soldered to the copper tube 41 by means of its vapor-deposited copper layer 43. The layer of solder is designated by 42. To obtain good electrical and thermal contact between the copper layer of the niobium foil and the copper tube of the cable and to avoid unnecessary heating of the niobium foil during the soldering operation, metals with high electric conductivity and low melting point are preferably use as soldering metal. A suitable soldering metal is, for example, an alloy of tin and about 6% by weight of silver with a melting point of about 250°C, or an alloy of tin and about 3.5% by weight of silver with a melting point of about 220°C, or an alloy of tin and about 48% by weight of lead and having a melting point of about 200°C.

Figure 5:
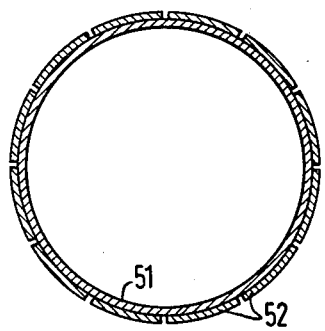
FIG. 5 is a sectional view of the copper tube provided with a plurality of copper-coated niobium carrier according to still another embodiment of the method invention.

FIG. 5 shows, in cross-section, a copper tube 51 of a superconducting cable on the outside of which several niobium strips 52 are arranged side by side, the strips having been vapor-deposited with copper. The copper layers vapor-deposited onto the niobium strips 52 and the solder joints to the tube 51 are not shown in detail in FIG. 5. The niobium foils can be arranged helically at the inside and/or outside of the copper tube.

The method according to the invention also permits the attachment of electrical contact to niobium conductors in a simple manner. This will be explained in more detail with reference to FIG. 6.

Figure 6:
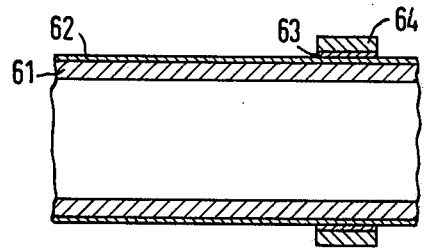
FIG. 6 is an elevation section view of a tubular copper-coated niobium carrier to the outer side of which additional copper has been soldered according to a further embodiment of the invention.

FIG. 6 shows in a longitudinal cross-section, a tubular niobium carier 61 on the outer side of which a copper layer 62 of about 3 $\mu$m thickness was vapor-deposited, for example, by means of the apparatus shown in FIG. 1 by heating the carrier to a temperature of about 300°C and guiding it over the evaporation source as well as rotating it about its axis. A copper ring 64 is soldered to the copper layer 62 by means of a solder layer 63 which may consist, for example, of the lead-tin alloy already referred to. The copper ring 64 serves as an electrically normal-conducting contact.

Figure 7:
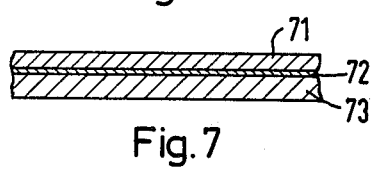
FIG. 7 is a section view of niobium foil coated with a vapor-deposited copper layer and which has been reinforced by an electrolytically deposited thick copper layer according to an embodiment of the method of the invention.

As mentioned, in the method according to the invention, additional electrically normal-conducting metal can be deposited electrolytically onto the copper layer which has been vapor-deposited onto the niobium carrier, the carrier being preferably in the form of a foil. Copper is especially desirable for this purpose. Through precipitation from a copper sulfate electrolyte with sulfuric acid, for example, thick layers of copper can be produced on the vapor-deposited copper layer. These thick layers then have good electrical and thermal contact with the niobium foil. FIG. 7 shows such a niobium foil, whose vapor-evaporated copper layer 72 is further reinforced by an electrolytically deposited thick copper layer 73. Such copper layers can also be deposited on a tubular niobium carrier on the outer side of which a copper layer has been vapor-deposited, as is shown, for example, in FIG. 6.

The conductor thus comprises respective portions of niobium and vapor-deposited copper as well as an additional portion which is, like the vapor-deposited copper, an electrically normal-conducting metal.

Although the method according to the invention can be applied to commercially available niobium foils, these can be, of course, advantageously subjected to a pretreatment for reducing alternating-current losses before copper is vapor-deposited thereon. In particular, the surface of the niobium foil can be smoothed by electro-polishing, whereby a considerable reduction of the alternating-current losses can be achieved. Also, to reduce the alternating-current losses, the niobium can first be subjected to an outgassing annealing treatment in an ultra-high vacuum at temperatures of about 2000°C.

What is claimed is:

1. Method of producing a conductor for a superconducting cable or the like, the conductor being made up of at least niobium and copper, the method comprising heating a niobium carrier to a temperature between 150° and 800°C in a vacuum having a residual gas pressure of at most $10^{-4}$ Torr and then letting the carrier cool down, evaporating copper onto the cooled down niobium carrier, and heating the copper-coated niobium carrier to form a tightly adhering copper layer thereon.

2. The method of claim 1 wherein the niobium carrier is heated in the first heating step until the surface thereof is clean, and wherein the copper-coated niobium carrier is heated until a diffusion bond is formed between the niobium carrier and the copper layer.

3. The method of claim 1 wherein the niobium carrier is a thin foil, and wherein the copper layer evaporated onto the thin foil carrier has a thickness of approximately 1 to 5 $\mu$m.

4. The method of claim 1 wherein the niobium carrier is tubular, and wherein the copper is evaporated onto the outer side of the tubular carrier.

5. The method of claim 1 wherein the niobium carrier is band-shaped, and wherein the copper is evaporated onto only one side of the band-shaped carrier.

6. The method of claim 1 wherein the niobium carrier is heated to a temperature between 200° and 600°C.

7. Method of producing a conductor for a superconducting cable or the like, the conductor being made up of at least niobium and electrically normal-conducting copper, the method comprising heating a band-shaped niobium carrier to a temperature between 150° and 800° C in a vacuum having a residual gas pressure of at most $10^{-4}$ Torr, evaporating copper unto only one side of the niobium carrier to form a tightly adhering copper layer thereon, and joining at least one copper-coated, band-shaped niobium carrier to a tube also made of an electrically normal-conducting metal, the carriers being joined to the tube at the side of the carriers coated with copper.

8. The method of claim 7 wherein the niobium carrier is soldered to the tube so as to join the copper-coated side of the carrier to the tube.

9. Method of producing a conductor for a superconducting cable or the like, the conductor having respective portions of niobium and copper as well as an additional portion, the copper being an electrically normal-conducting metal and the additional portion also consisting of electrically normal-conducting metal, the method comprising heating a niobium carrier to a temperature between 150° and 800°C in a vacuum having a residual gas pressure of at most $10^{-4}$ Torr, evaporating copper unto the niobium carrier to form a tightly adhering copper layer thereon, and joining the copper-coated niobium carrier to an electrically normal-conducting metal constituting the additional portion.

10. The method of claim 9 wherein the copper layer portion of the niobium carrier is alloyed to the electrically normal-conducting metal of the additional portion.

* * * * *